United States Patent
Huang et al.

(10) Patent No.: US 10,504,756 B2
(45) Date of Patent: *Dec. 10, 2019

(54) WAFER PROCESSING METHOD AND APPARATUS

(71) Applicant: Taiwan Semiconductor Manufacturing Company, Ltd., Hsinchu (TW)

(72) Inventors: Chih-Hui Huang, Yongkang (TW); Chun-Han Tsao, New Taipei (TW); Sheng-Chau Chen, Tainan (TW); Yeur-Luen Tu, Taichung (TW); Chia-Shiung Tsai, Hsinchu (TW); Xiaomeng Chen, Baoshan Township (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/830,482

(22) Filed: Dec. 4, 2017

(65) Prior Publication Data

US 2018/0090348 A1    Mar. 29, 2018

Related U.S. Application Data

(63) Continuation of application No. 14/163,460, filed on Jan. 24, 2014, now Pat. No. 9,837,291.

(51) Int. Cl.
*H01L 21/67*     (2006.01)
*H01L 21/18*     (2006.01)
(Continued)

(52) U.S. Cl.
CPC ...... *H01L 21/67092* (2013.01); *H01L 21/187* (2013.01); *H01L 21/6838* (2013.01); *H01L 21/68735* (2013.01); *H01L 21/76251* (2013.01); *H01L 22/12* (2013.01); *Y10T 156/1744* (2015.01)

(58) Field of Classification Search
CPC ............ H01L 21/6838; H01L 21/67092
See application file for complete search history.

(56) References Cited

U.S. PATENT DOCUMENTS 4,298,273 A    11/1981  Nishizuka et al.
5,129,827 A    7/1992   Hoshi et al.
(Continued)

FOREIGN PATENT DOCUMENTS

JP    H0794675 A    4/1995
JP    2005043871 A   2/2005
(Continued)

*Primary Examiner* — Xia L Cross
(74) *Attorney, Agent, or Firm* — Slater Matsil, LLP

(57) ABSTRACT

An apparatus for and a method of bonding a first substrate and a second substrate are provided. In an embodiment a first wafer chuck has a first curved surface and a second wafer chuck has a second curved surface. A first wafer is placed on the first wafer chuck and a second wafer is placed on a second wafer chuck, such that both the first wafer and the second wafer are pre-warped prior to bonding. Once the first wafer and the second wafer have been pre-warped, the first wafer and the second wafer are bonded together.

20 Claims, 5 Drawing Sheets

(51) Int. Cl.
  *H01L 21/762* (2006.01)
  *H01L 21/683* (2006.01)
  *H01L 21/687* (2006.01)
  *H01L 21/66* (2006.01)

(56) References Cited

U.S. PATENT DOCUMENTS

| | | | |
|---|---|---|---|
| 5,273,553 A | 12/1993 | Hoshi et al. | |
| 5,500,540 A | 3/1996 | Jewell et al. | |
| 6,032,997 A * | 3/2000 | Elliott | B25B 11/005 269/21 |
| 6,413,851 B1 | 7/2002 | Chow et al. | |
| 6,426,282 B1 * | 7/2002 | Saigal | H01L 21/6833 257/E21.508 |
| 6,892,769 B2 | 5/2005 | Hong | |
| 7,435,311 B1 | 10/2008 | Marzen et al. | |
| 7,479,441 B2 | 1/2009 | Kirk et al. | |
| 7,651,937 B2 | 1/2010 | Hsieh et al. | |
| 7,980,287 B2 | 7/2011 | Hwang | |
| 8,307,543 B2 | 11/2012 | Lee | |
| 8,575,002 B2 | 11/2013 | Broekaart et al. | |
| 9,018,758 B2 | 4/2015 | Hwang et al. | |
| 9,040,334 B2 | 5/2015 | Chu et al. | |
| 9,490,158 B2 | 11/2016 | Huang et al. | |
| 9,576,827 B2 | 2/2017 | Liu et al. | |
| 2004/0018803 A1 | 1/2004 | Boumerzoug et al. | |
| 2005/0018122 A1 | 1/2005 | Hong | |
| 2006/0292822 A1 * | 12/2006 | Xie | H01L 21/187 438/455 |
| 2010/0097738 A1 | 4/2010 | Kang et al. | |
| 2010/0120222 A1 * | 5/2010 | Kim | H01L 21/187 438/455 |
| 2010/0139836 A1 | 6/2010 | Horikoshi | |
| 2010/0248446 A1 | 9/2010 | Liu et al. | |
| 2012/0006463 A1 | 1/2012 | Gaudin | |
| 2012/0024456 A1 | 2/2012 | Lin et al. | |
| 2012/0186741 A1 | 7/2012 | Lake | |
| 2012/0193009 A1 | 8/2012 | Fujii | |
| 2012/0193787 A1 | 8/2012 | Maitani et al. | |
| 2013/0101372 A1 | 4/2013 | Tschinderle et al. | |
| 2013/0256824 A1 * | 10/2013 | Mizuta | H01L 27/1464 257/459 |
| 2014/0261960 A1 | 9/2014 | Lin et al. | |
| 2015/0210057 A1 * | 7/2015 | Wagenleithner | B32B 37/0076 156/290 |
| 2015/0214082 A1 | 7/2015 | Huang et al. | |

FOREIGN PATENT DOCUMENTS

| | | |
|---|---|---|
| JP | 5107911 B2 | 12/2012 |
| JP | 2013258377 A | 12/2013 |
| KR | 20100043478 A | 4/2010 |
| KR | 20160015133 A | 2/2016 |
| TW | 531873 B | 5/2003 |
| TW | 200508017 A | 3/2005 |
| TW | I244433 B | 12/2005 |
| TW | 200709311 A | 3/2007 |
| TW | 200913815 A | 3/2009 |
| TW | 201145482 A | 12/2011 |
| TW | 201225194 A | 6/2012 |
| TW | 201324629 A | 6/2013 |
| TW | 201436068 A | 9/2014 |
| WO | 2014191033 A1 | 12/2014 |

* cited by examiner

WAFER PROCESSING METHOD AND APPARATUS

PRIORITY CLAIM AND CROSS-REFERENCE

This application is a continuation of U.S. application Ser. No. 14/163,460, entitled "Wafer Processing Method and Apparatus," filed on Jan. 24, 2014, which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

Some methods of forming semiconductor devices involve bonding together two wafers. The wafers may be bonded together using fusion bonding, eutectic bonding, and hybrid bonding, as examples.

BRIEF DESCRIPTION OF THE DRAWINGS

For a more complete understanding of the present embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use respective embodiments, and do not limit the scope of the present disclosure.

Figure 1:
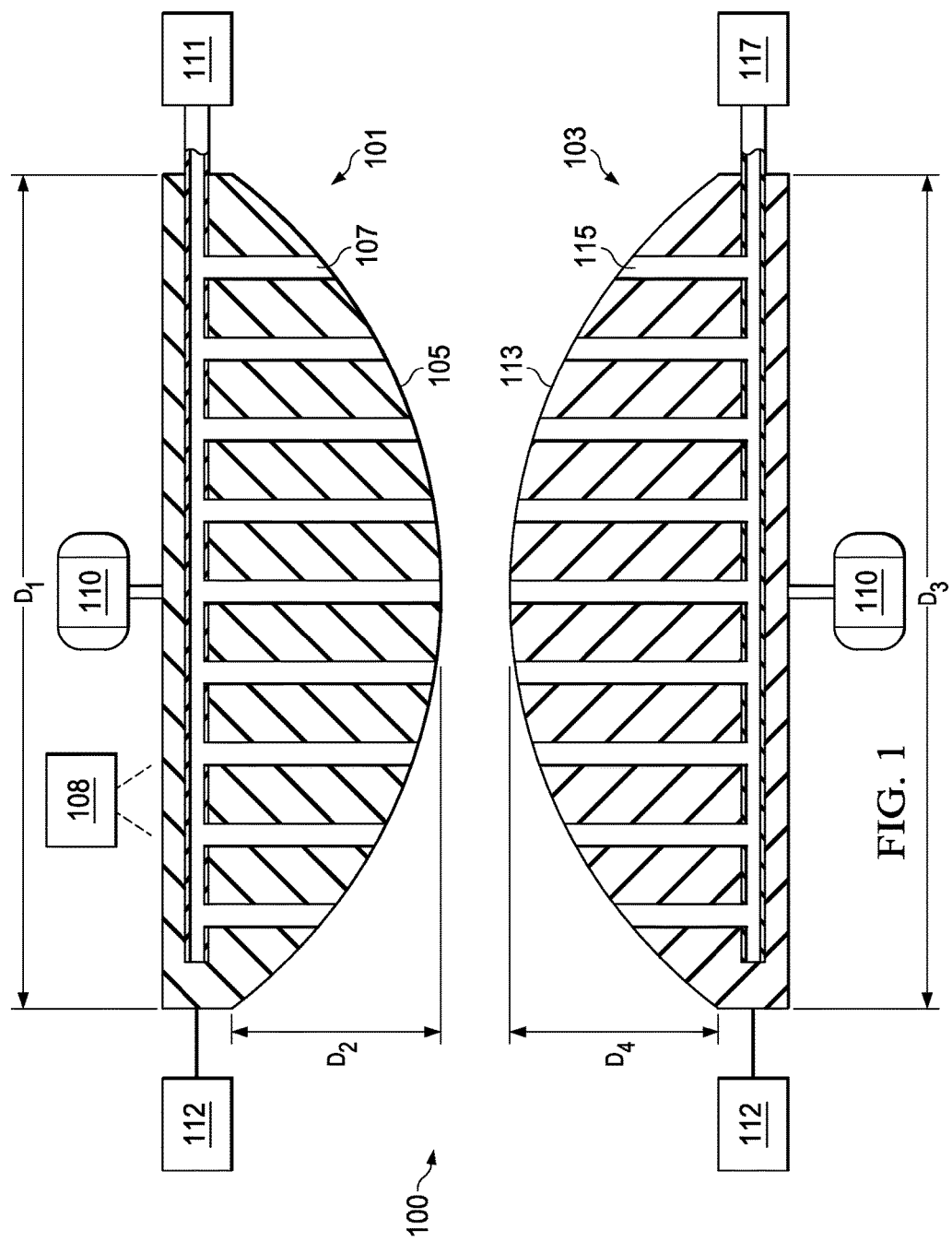
FIG. 1 illustrates a wafer bonding system in accordance with an embodiment.

FIG. 1 illustrates a wafer bonding system 100 with a first wafer chuck 101 and a second wafer chuck 103 that can be positioned to face each other. In an embodiment the first wafer chuck 101 and the second wafer chuck 103 are used to bond a first semiconductor wafer 201 (not illustrated in FIG. 1 but illustrated and discussed below with respect to FIG. 2) to a second semiconductor wafer 203 (also not illustrated in FIG. 1 but illustrated and discussed below with respect to FIG. 2). In an embodiment the first wafer chuck 101 has a first curved surface 105 that has a series of first openings 107 along the length of the first surface.

In an embodiment the first wafer chuck 101 comprises any suitable material that may be processed to have the first openings 107 along the first curved surface 105. In an embodiment, for example, silicon based materials, such as glass, silicon oxide, silicon nitride, or other materials, such as aluminum oxide, combinations of any of these materials, or the like may be used. Additionally, the first wafer chuck 101 may have a diameter that is suitable to hold the first semiconductor wafer 201. As such, while the size of the first wafer chuck 101 will be in some ways dependent upon the size of the first semiconductor wafer 201, the first wafer chuck 101 can have a first distance $D_1$ of about 250 mm and about 300 mm, while the first curved surface 105 may extend away from the remainder of the first wafer chuck 101 a second distance $D_2$ of between about 0 μm and about 20 μm. Additionally, the first curved surface 105 of the first wafer chuck 101 may have a curvature of between about 0 μm and about 20 μm in order to induce a warpage in the first semiconductor wafer 201 when the first semiconductor wafer 201 is placed on the first wafer chuck 101. In a specific example, the first curved surface 105 has a deformation of about 3 μm from the center of the first wafer chuck 101 to the edge of the first wafer chuck 101.

In an embodiment the first openings 107 are connected to a vacuum pump 111. During operation the vacuum pump 111 will evacuate any gases from the first openings 107, thereby lowering the pressure within the first openings 107. When the first semiconductor wafer 201 is placed against the first curved surface 105 and the pressure within the first openings 107 has been reduced by the vacuum pump 111, the pressure difference between the side of the first semiconductor wafer 201 facing the first openings 107 and the side of the first semiconductor wafer 201 facing away from the first openings 107 will hold the first semiconductor wafer 201 against the first curved surface 105. Additionally, the pressure difference will also warp the first semiconductor wafer 201 into a similarly curved shape as the first curved surface 105.

In an alternative embodiment, the first wafer chuck 101 may comprise a flat surface (not illustrated in FIG. 1) rather than the curved surface 105. In this embodiment, the first wafer chuck 101 may utilize a pin that extends through the first wafer chuck 101 in order to warp the first semiconductor wafer 201 after the first semiconductor wafer 201 has been attached to the first wafer chuck 101.

The second wafer chuck 103 may be similar to the first wafer chuck 101, and may have a second curved surface 113, second openings 115 to the second curved surface 113, and a second vacuum pump 117. In an embodiment the second curved surface 113 may be similar to the first curved surface 105, although alternatively the second curved surface 113 may have different dimensions from the first curved surface 105. Similarly, the second openings 115 may be similar to the first openings 107, and may also be used to hold and warp the second semiconductor wafer 203 to the second wafer chuck 103.

In an embodiment, however, the second curved surface 113 of the second wafer chuck 103 has a smaller curvature than the first curved surface 105 of the first wafer chuck 101. For example, the second wafer chuck 103 may have a third distance $D_3$ of between about 250 mm and about 300 mm, while the second curved surface 113 may extend out from the remainder of the second wafer chuck 103 a fourth distance $D_4$ of between about 30 μm and about 70 μm. In a specific example, the second curved surface 113 has a deformation of less than about 2 μm from the center of the second wafer chuck 103 to the edge of the second wafer chuck 103.

A motor 110 may be coupled to each of the first wafer chuck 101 and the second wafer chuck 103 in some embodiments. One motor 110 may be coupled to both the first wafer chuck 101 and the second wafer chuck 103 in other embodiments. The motor 110 comprises a piezoelectric motor or a linear motor in some embodiments. Alternatively, the motor 110 may comprise other types of motors. The motor 110 is adapted to adjust an x position, a y position, a z position, and/or an angular position (θ) of the first semiconductor wafer 201 and/or the second semiconductor wafer 203 in some embodiments.

In some embodiments, the wafer bonding system 100 further comprises a thermal controller 112 for thermally controlling the first semiconductor wafer 201 or the second semiconductor wafer 203. The thermal controller 112 for thermally controlling the first semiconductor wafer 201 or the second semiconductor wafer 203 may be coupled to the second wafer chuck 103, or the thermal controller 112 for thermally controlling the first semiconductor wafer 201 or the second semiconductor wafer 203 may be coupled to the first wafer chuck 101. In embodiments wherein the thermal controller 112 for thermally controlling the first semiconductor wafer 201 or the second semiconductor wafer 203 is coupled to the second wafer chuck 103, the thermal controller 112 is adapted to thermally control the second semiconductor wafer 203, as an example. In embodiments wherein the thermal controller 112 is coupled to the first wafer chuck 101, the thermal controller 112 is adapted to thermally control the first semiconductor wafer 201, as another example. In some embodiments, a thermal controller 112 is coupled to the first wafer chuck 101, and a thermal controller 112 is also coupled to the second wafer chuck 103, as yet another example. The thermal controller 112 for thermally controlling the first semiconductor wafer 201 or the second semiconductor wafer 203 is adapted to control a temperature of the first semiconductor wafer 201 and/or the second semiconductor wafer 203 to a temperature of about 20 degrees Celsius (C) to about 25 degrees C.+/− about 2.0 degrees C. with about a 0.05 degrees C. resolution, in some embodiments. Alternatively, the thermal controller 112 is adapted to control wafer temperature at other temperature ranges and tolerances, in other embodiments. In some embodiments, a thermal controller 112 for thermally controlling the first semiconductor wafer 201 or the second semiconductor wafer 203 temperatures is not included for the wafer bonding system 100.

The thermal controller 112 comprises a thermal couple or a thermal plate in some embodiments. Alternatively, the thermal controller 112 may comprise other devices or instruments adapted to control the first semiconductor wafer 201 or the second semiconductor wafer 203 temperature. Including the thermal controller 112 and heating the first semiconductor wafer 201 or the second semiconductor wafer 203 during the bonding process decreases or eliminates intrinsic run-out, e.g., the first semiconductor wafer 201 or the second semiconductor wafer 203 difference wherein alignment can become worse of bonded wafers from the center to the edge, in some embodiments.

Additionally, in an embodiment an alignment monitor 108 is connected to the motor 110 using, e.g., wiring (not individually illustrated in FIG. 1). The alignment monitor 108 can emit infrared (IR) energy towards and through, e.g., the first wafer chuck 101 in order to check the alignment of the first semiconductor wafer 201 and the second semiconductor wafer 203. This information may then be passed to the motor 110 in order to perform any corrections that may be desired prior to the completed bonding of the first semiconductor wafer 201 and the second semiconductor wafer 203.

Figure 2:
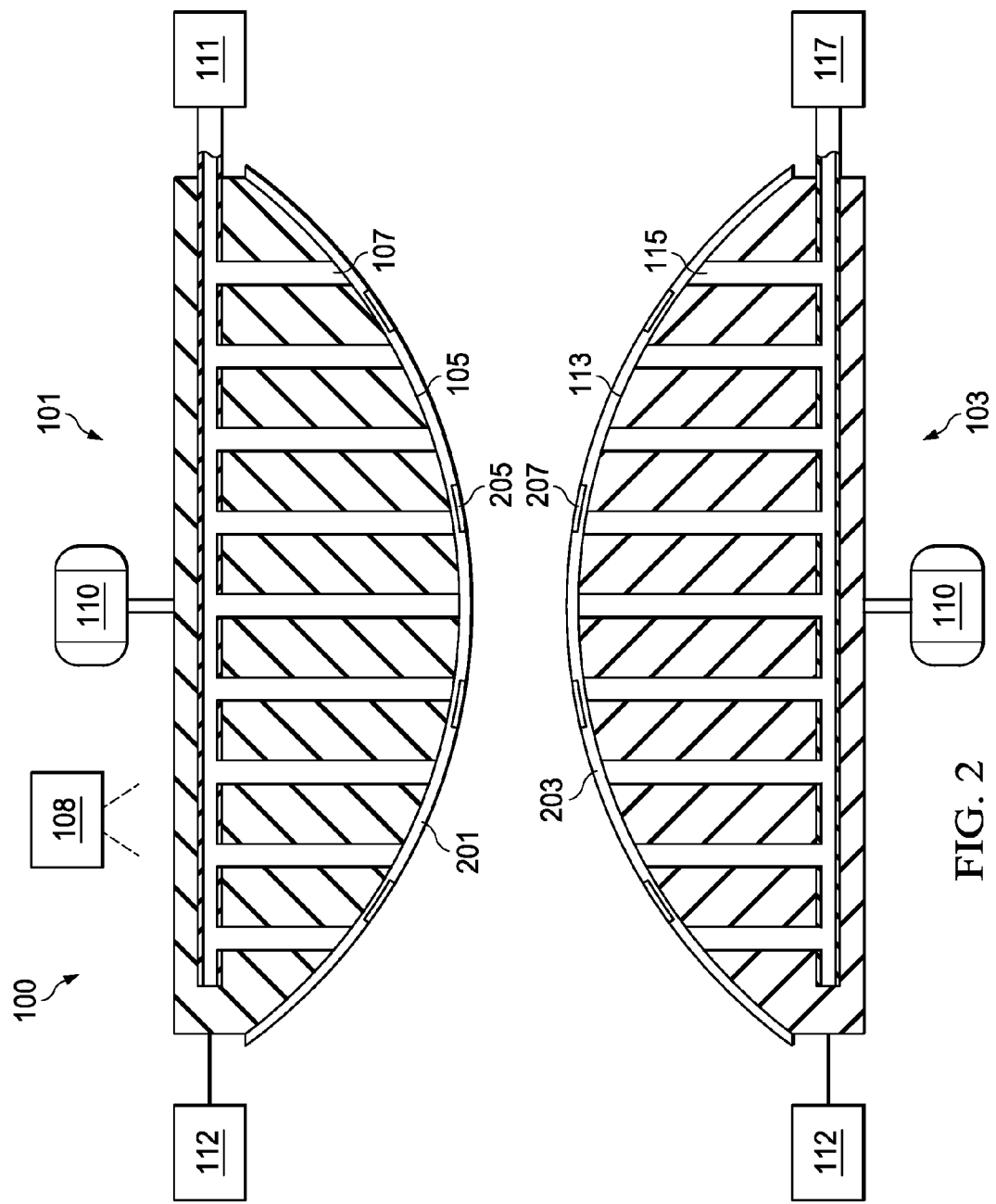
FIG. 2 illustrates a placement of a first wafer and a second wafer into the wafer bonding system in accordance with an embodiment.

FIG. 2 illustrates a placement of the first semiconductor wafer 201 onto the first wafer chuck 101. The first semiconductor wafer 201 may comprise a semiconductor substrate, e.g., bulk silicon, doped or undoped, or a layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

Additionally, the first semiconductor wafer 201 may also comprise dielectric and metallization layers over the semiconductor substrate in order to form a plurality of dies on the first semiconductor wafer 201. These dies may be any suitable type of die, such as an application-specific integrated circuit (ASIC) device. However, any other suitable type of devices, such as system on a chip type of devices, may alternatively be utilized.

The second semiconductor wafer 203 may be similar to the first semiconductor wafer 201, such as by comprising, e.g., a semiconductor substrate such as bulk silicon, a layer of an SOI substrate, or the like. Alternatively, the second semiconductor wafer 203 may be an insulative layer on a semiconductor layer that will be bonded to the first semiconductor wafer 201 in order to form an SOI substrate. Any suitable combination of materials that are desired to be bonded together may alternatively be utilized, and all such combinations are fully intended to be included within the scope of the embodiments.

Additionally, the second semiconductor wafer 203 may also comprise dielectric and metallization layers over the semiconductor substrate in order to form a plurality of dies on the second semiconductor wafer 203. These dies may be any suitable type of die, such as an ASIC device. However, any other suitable type of devices, such as system on a chip type of devices, may alternatively be utilized.

In a specific embodiment the first semiconductor wafer 201 may comprise a wafer with a plurality of ASIC dies that have been manufactured from the semiconductor substrate. Additionally, the second semiconductor wafer 203 may comprise a wafer with system on a chip (SOC) devices on it that are desired to be bonded to the ASIC dies on the first semiconductor wafer 201.

Additionally, in an embodiment the first semiconductor wafer 201 further has first alignment marks 205 and the second semiconductor wafer 203 has second alignment marks 207. The first alignment marks 205 and the second alignment marks 207 may be formed in the first semiconductor wafer 201 and the second semiconductor wafer 203 using a patterning process. The first alignment marks 205 and the second alignment marks 207 will be used to assist in the positioning of the first semiconductor wafer 201 and the second semiconductor wafer 203.

Optionally, before placing the first semiconductor wafer 201 on the first wafer chuck 101 and placing the second semiconductor wafer 203 on the second wafer chuck 103, in some embodiments the first semiconductor wafer 201 and/or the second semiconductor wafer 203 are exposed to a plasma process. The plasma process activates the wafer surface and facilitates the bonding process. In some embodiments, the first semiconductor wafer 201 and/or the second semiconductor wafer 203 are cleaned after the plasma process. The cleaning process may comprise using cleaning arms, a drain system, and a spin module to keep the wafer surface clean and activated, as examples. A cleaning solvent including deionized (DI) water, acid, and/or alkalinity can be used to remove/protect the bonding surface, for example. Alternatively, other cleaning solvents and processes may be used. The plasma process and/or the cleaning process are not included in the bonding process flow in some embodiments.

In an embodiment the first semiconductor wafer 201 is placed onto the first wafer chuck 101 in a planar condition. Once in place on the first wafer chuck 101, the vacuum pump 111 is initiated, lowering the pressure within the first openings 107, holding the first semiconductor wafer 201 to the first wafer chuck 101, and warping the first semiconductor wafer 201 into a warped, non-planar shape. Optionally, a small force may be applied to the first semiconductor wafer 201 to help mold the first semiconductor wafer 201 to the first wafer chuck 101 and position the first semiconductor wafer 201 against all of the first openings 107.

FIG. 2 also illustrates a placement of the second semiconductor wafer 203 against the second wafer chuck 103. Similar to the placement of the first semiconductor wafer 201, the second semiconductor wafer 203 may be placed adjacent to the second wafer chuck 103 and the second vacuum pump 117 is initiated to lower the pressure within the second openings 115. With the pressure lowered within the second openings 115, the second semiconductor wafer 203 will be warped into the same shape as the second curved surface 113. Also, if desired, a small force may be applied to the second semiconductor wafer 203 in order to position each part of the second semiconductor wafer against the second openings 115.

The alignment monitor 108 and the motor 110 are electrically connected together by wiring (not individually illustrated in FIG. 1). In an embodiment the alignment monitor 108 is activated to emit the IR energy 125 towards and through the first wafer chuck 101, the first semiconductor wafer 201, and the first alignment marks 205 on the first semiconductor wafer 201 to the second alignment marks 207 on the second semiconductor wafer 203. The motor 110 receives the information regarding the location of the second semiconductor wafer 203 from the alignment monitor 108 and adjusts the position of the second semiconductor wafer 203 relative to the position of the first semiconductor wafer 201 to perform an initial alignment of the first semiconductor wafer 201 and the second semiconductor wafer 203.

If desired, a fine alignment may optionally be performed using the alignment monitor 108 which continues to emit IR energy 125 and the motor 110. Such a fine alignment may be utilized to ensure that the first alignment marks 205 and the second alignment marks 207 are aligned with each other after the coarse alignment described above.

Figure 3:
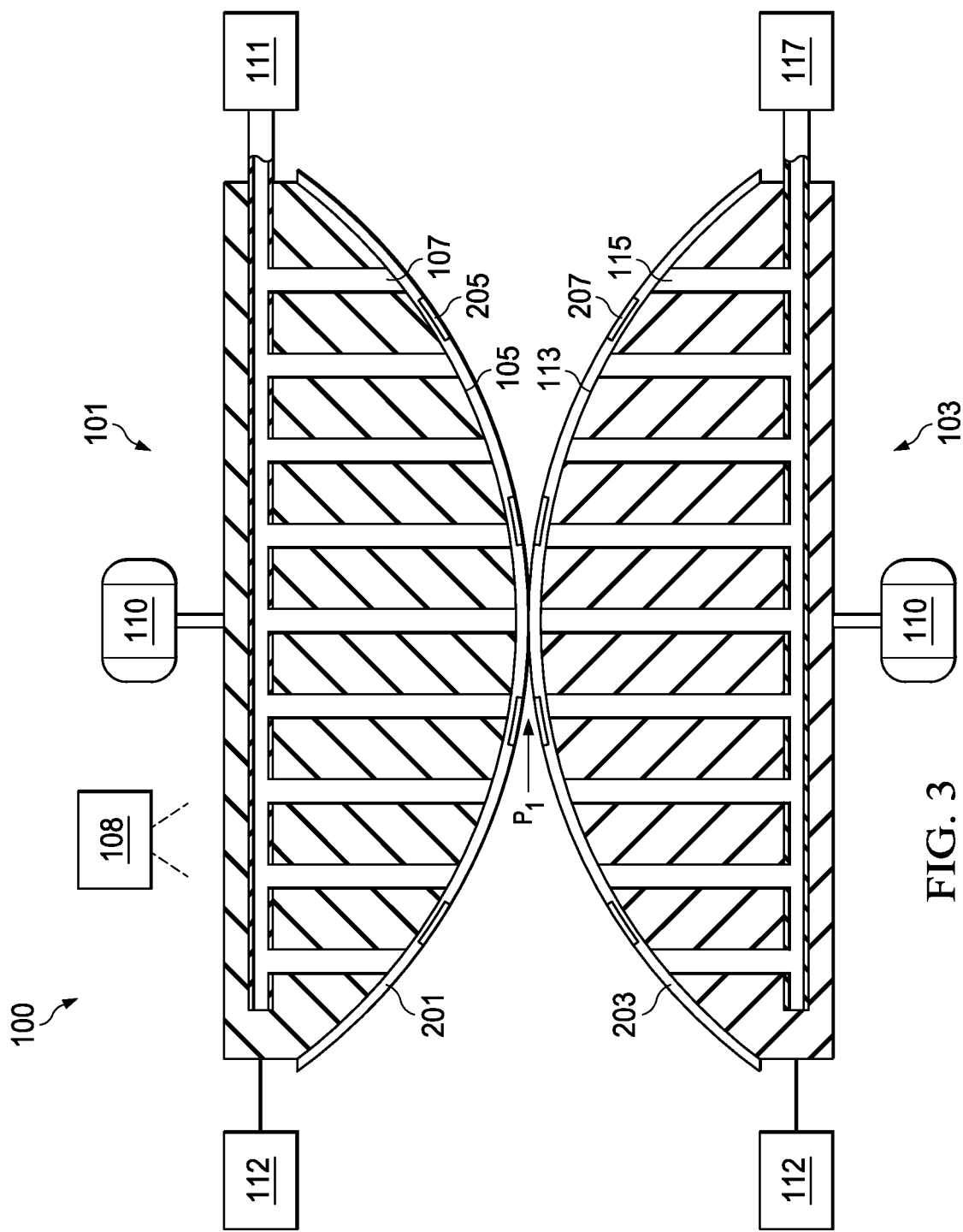
FIG. 3 illustrates an initiation of a bonding process in accordance with an embodiment.

FIG. 3 illustrates an initiating of a bonding process to bond the first semiconductor wafer 201 and the second semiconductor wafer 203. In an embodiment the first wafer chuck 101 and the second wafer chuck 103 are moved (e.g., by the motor 110) relative to each other such that the first alignment marks 205 and the second alignment marks 207 are aligned with each other. Once aligned, the first semiconductor wafer 201 (which has been pre-warped) and the second semiconductor wafer 203 (which has also been pre-warped) are brought into contact a first point $P_1$. Once in contact, the first semiconductor wafer 201 and the second semiconductor wafer 203 will begin to bond at the first point $P_1$.

Once in contact, the first wafer chuck 101 and the second wafer chuck 103 are used to apply pressure between the first semiconductor wafer 201 and the second semiconductor wafer 203. In an embodiment the pressure may be between about 50 mN and about 1,000 mN. Additionally, if desired, heat may be added using the thermal controller 112. In an embodiment the temperature may be controlled between about 20° C. and about 25° C., although any suitable temperature that can be used to aid in the bonding process may alternatively be used.

As the pressure is applied to the now-contacted first semiconductor wafer 201 and the second semiconductor wafer 203, the first semiconductor wafer 201 and the second semiconductor wafer 203 will bond together at each point where the first semiconductor wafer 201 comes into contact with the second semiconductor wafer 203. As both the first semiconductor wafer 201 and the second semiconductor wafer 203 are pre-warped in different directions, this pressure will cause the bonding to proceed in a wave from the first point $P_1$ and moving outwards towards the edges of the first semiconductor wafer 201 and the second semiconductor wafer 203.

Figure 4:
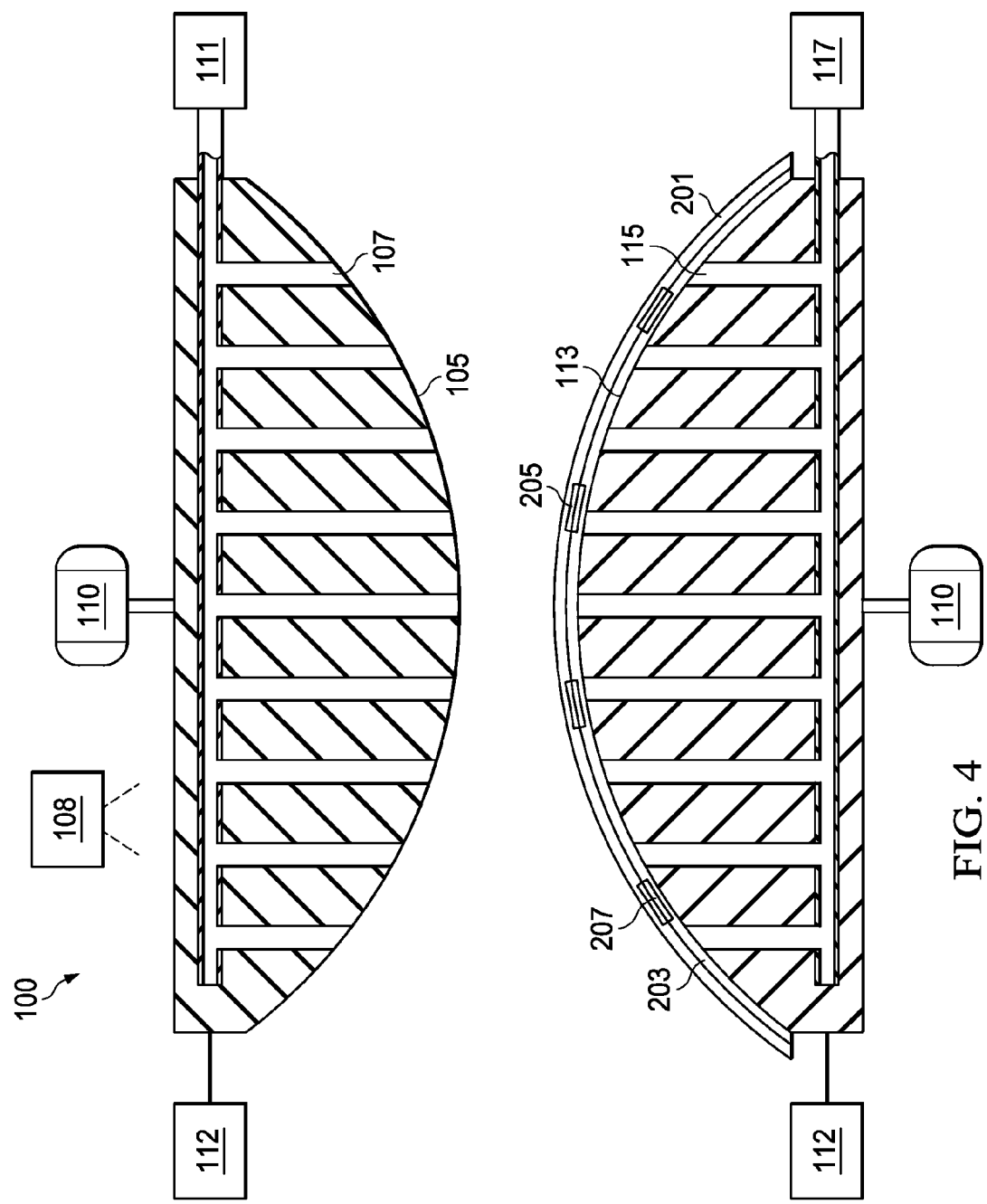
FIG. 4 illustrates an ending of a bonding process in accordance with an embodiment.

FIG. 4 illustrates a removal of the first wafer chuck 101 from the now bonded first semiconductor wafer 201 and the second semiconductor wafer 203. In an embodiment the first wafer chuck 101, in which the vacuum has been removed, is moved by the motor 110 away from the bonded first semiconductor wafer 201 and the second semiconductor wafer 203, leaving the bonded first semiconductor wafer 201 and second semiconductor wafer 203 on the second wafer chuck 103.

Figure 5:
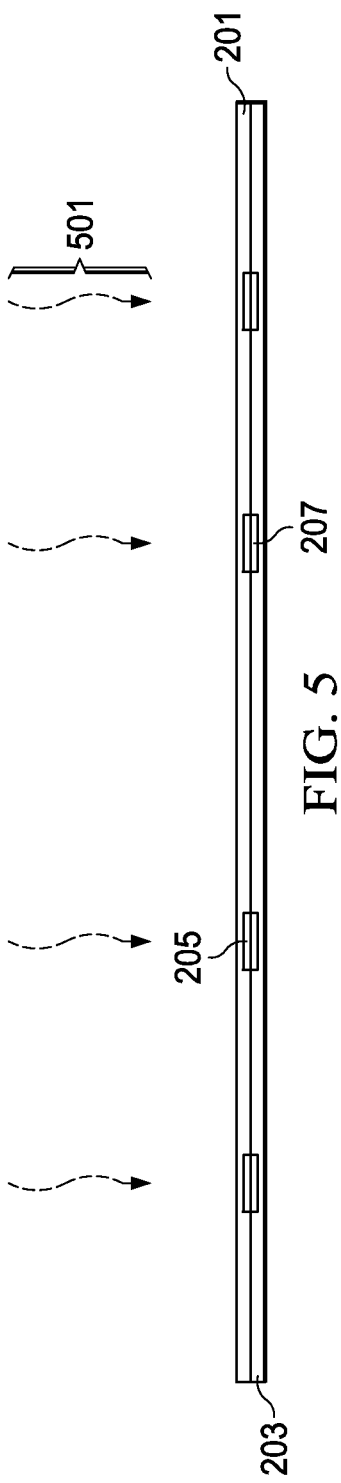
FIG. 5 illustrates an alignment measuring process in accordance with an embodiment.

FIG. 5 illustrates a removal of the bonded first semiconductor wafer 201 and second semiconductor wafer 203 from the second wafer chuck 103. In an embodiment in which the second openings 115 are utilized to hold the second semiconductor wafer 203 to the second wafer chuck 103, the second vacuum pump 117 may be turned off and an atmospheric pressure may be allowed to enter the second openings 115. Once the pressure has risen in the second openings 115, the bonded first semiconductor wafer 201 and second semiconductor wafer 203 may be removed from the second wafer chuck 103.

FIG. 5 additionally illustrates an infrared (IR) measurement that can be performed to check the alignment of the bonding. In an embodiment IR energy 501 is directed through the first semiconductor wafer 201 or the second semiconductor wafer 203 to the first alignment marks 205 and the second alignment marks 207 and the misalignment of the first alignment marks 205 and the second alignment marks 207 may be measured.

However, due to the use of curved surfaces on both the first wafer chuck 101 and the second wafer chuck 103, along with the pre-warping of the first semiconductor wafer 201 and the second semiconductor wafer 203 prior to bonding, the natural warpage of the first semiconductor wafer 201 and the second semiconductor wafer 203 (also known as run-out) that occurs and impairs the alignment accuracy of the bonding process can be minimized. For example, in an embodiment the alignment accuracy shift in both the X direction and the Y direction for a bonding process as discussed above may be reduced to less than 0.5 µm by 40 µm.

In accordance with an embodiment, a method of bonding wafers comprising warping a first wafer prior to bonding to form a warped first wafer is provided. A second wafer is warped prior to bonding to form a warped second wafer. The first warped wafer is bonded to the second warped wafer.

In accordance with another embodiment, a method of bonding wafers comprising placing a first wafer onto a first wafer chuck, wherein the first wafer chuck warps the first wafer, and placing a second wafer onto a second wafer chuck, wherein the second wafer chuck warps the second wafer. The first wafer and the second wafer are placed into contact with each other.

In accordance with yet another embodiment, a wafer bonding system comprising a first wafer chuck with a first curved surface is provided. A second wafer chuck has a second curved surface, the first wafer chuck and the second wafer chuck being movable relative to each other.

Although the present disclosure and its advantages have been described in detail, it should be understood that various changes, substitutions and alterations can be made herein without departing from the spirit and scope of the disclosure as defined by the appended claims. For example, different types of materials and processes may be varied while remaining within the scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present embodiments, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of bonding wafers, the method comprising:
physically attaching a first wafer to a first curved surface of a first wafer chuck, wherein the first curved surface is one of silicon oxide, silicon nitride, glass, or aluminum oxide and wherein the first curved surface is curved prior to both an application of a first vacuum to the first wafer chuck and an attachment of a plurality of dies within the first wafer and wherein the first curved surface comprises an attachment mechanism to physically attach the first wafer to the first curved surface such that the first wafer is warped and physically in contact with the first curved surface; and
physically attaching a second wafer to a second surface of a second wafer chuck, wherein the second surface is curved prior to both an application of a second vacuum to the second wafer chuck and an attachment of the second wafer, the first wafer chuck and the second wafer chuck being movable relative to each other, wherein the second surface comprises an attachment mechanism to physically attach the second wafer to the second surface such that the second wafer is in contact with the second surface.

2. The method of claim 1, further comprising contacting the first wafer to the second wafer at a first point after the physically attaching the first wafer to the first curved surface and after the physically attaching the second wafer to the second surface.

3. The method of claim 2, further comprising stopping the application of the first vacuum after the contacting the first wafer to the second wafer.

4. The method of claim 1, further comprising modifying a first temperature of the first wafer using a first temperature controller.

5. The method of claim 4, further comprising modifying a second temperature of the second wafer using a second temperature controller.

6. The method of claim 1, wherein the first curved surface has a deformation of about 3 µm from a center of the first wafer chuck to an edge of the first wafer chuck.

7. A system for bonding wafers comprising:
a first surface of a first wafer chuck, wherein the first surface is one of silicon oxide, silicon nitride, glass, or aluminum oxide and the first surface having a convex first curvature greater than zero and being curved prior to both an application of a first vacuum to the first wafer chuck and an attachment of a plurality of dies within a first wafer;
vacuum openings extending through the first curvature of the first surface;
a second surface of a second wafer chuck movable relative to the first surface of the first wafer chuck, the second surface having a convex static second curvature less than the first curvature and greater than zero, having a deformation of less than 2 µm, and wherein the second surface is curved prior to both an application of a second vacuum to the second wafer chuck and an attachment of a second wafer; and
vacuum openings extending through the second curvature of the second surface.

8. The system of claim 7, the first surface being glass.

9. The system of claim 7, the first surface being aluminum oxide.

10. The system of claim 7, the first surface being silicon oxide.

11. The system of claim 7, the first surface being silicon nitride.

12. The system of claim 7, further comprising a temperature controller.

13. The system of claim 12, wherein the temperature controller comprises a thermal plate.

14. The system of claim 7, wherein the first wafer chuck has a first length of between about 250 mm and about 300 mm.

15. The system of claim 7, further comprising an alignment monitor.

16. The system of claim 15, wherein the alignment monitor is an infrared alignment monitor.

17. A system for bonding wafers comprising:
a first surface of a first wafer chuck, the first surface being curved prior to both an application of a first vacuum to the first wafer chuck and an attachment of a plurality of dies within a first wafer, wherein the first surface is glass and wherein the first surface has a first convex curvature and a deformation of less than 2 µm from a center of the first surface to an edge of the first surface;
a second surface of a second wafer chuck movable relative to the first surface of the first wafer chuck, the second surface having a second convex curvature, wherein the second surface is curved prior to both an application of a second vacuum to the second wafer chuck and an attachment of a second wafer, the first convex curvature being smaller than the second convex curvature; and an alignment unit located to emit infrared energy through the first surface.

18. The system of claim 17, wherein the second surface has a curvature of less than about 3 μm from a center of the second wafer chuck to an edge of the second wafer chuck and wherein the first surface has a curvature of about 2 μm from a center of the first wafer chuck to an edge of the first wafer chuck.

19. The system of claim 17, further comprising a temperature controller.

20. The system of claim 17, wherein the first wafer chuck has a first length of between about 250 mm and about 300 mm.

* * * * *